United States Patent
Rondot et al.

(10) Patent No.: US 11,105,833 B2
(45) Date of Patent: Aug. 31, 2021

(54) CURRENT SENSORS AND ASSOCIATED MEASUREMENT SYSTEMS

(71) Applicant: Schneider Electric Industries SAS, Rueil Malmaison (FR)

(72) Inventors: Loïc Rondot, Gieres (FR); Lionel Urankar, Fontaine (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 15/930,988

(22) Filed: May 13, 2020

(65) Prior Publication Data

US 2020/0386792 A1 Dec. 10, 2020

(30) Foreign Application Priority Data

Jun. 7, 2019 (FR) ...................................... 1906093

(51) Int. Cl.
  *G01R 15/18* (2006.01)
  *H01F 3/10* (2006.01)

(52) U.S. Cl.
  CPC ......... *G01R 15/181* (2013.01); *G01R 15/188* (2013.01); *H01F 3/10* (2013.01); *H01F 2003/106* (2013.01)

(58) Field of Classification Search
  CPC .... G01R 15/181; G01R 15/188; G01R 19/00; G01R 19/0092; G01R 19/0023; G01R 19/0069; G01R 19/08; H01F 3/10; H01F 2003/106
  See application file for complete search history.

(56) References Cited

U.S. PATENT DOCUMENTS

| | | | |
|---|---|---|---|
| 6,366,076 B1* | 4/2002 | Karrer ................. | G01R 15/181 324/117 R |
| 2008/0079418 A1* | 4/2008 | Rea ...................... | G01R 15/181 324/117 R |
| 2009/0058398 A1 | 3/2009 | Ibuki | |
| 2011/0285412 A1* | 11/2011 | Ibuki .................... | G01R 15/142 324/686 |

(Continued)

FOREIGN PATENT DOCUMENTS

FR  3033647  9/2016

OTHER PUBLICATIONS

Search Report and Written Opinion for French Patent Application No. FR 1906093 dated Mar. 25, 2020, 6 pages.

*Primary Examiner* — Son T Le
(74) *Attorney, Agent, or Firm* — Locke Lord LLP

(57) ABSTRACT

Current sensors and associated measurement systems. A current sensor includes:
  an insulating substrate provided with a central opening;
  a Rogowski winding surrounding the central opening and including a first coil and a second coil which are superposed and electrically connected in series, the first coil and the second coil being wound around the substrate along a first contour line and a second contour line, respectively, each contour line defining, in the plane of the substrate, a contour in the shape of a quadrilateral centred on the central opening;
wherein a length of the contour in the shape of a quadrilateral defined by the first contour line is greater than a length of the quadrilateral defined by the second contour line and a width thereof is smaller than a width of the quadrilateral defined by the second contour line.

10 Claims, 9 Drawing Sheets

(56) References Cited

U.S. PATENT DOCUMENTS

2017/0356935 A1\* 12/2017 Hurwitz ................ G01R 19/12
2018/0052191 A1 2/2018 Kern
2019/0154733 A1 5/2019 Joo \* cited by examiner

CURRENT SENSORS AND ASSOCIATED MEASUREMENT SYSTEMS

TECHNICAL FIELD

The present invention relates to current sensors and to associated measurement systems.

BACKGROUND

Rogowski windings are current sensors capable of measuring the intensity of an AC current flowing through an electrical conductor.

Such a sensor generally includes a coil wound around a closed contour line around a central opening in which the electrical conductor is received. The current flowing through the electrical conductor induces an electric voltage across the terminals of the winding.

Rogowski windings may be manufactured on a printed circuit board (PCB). For example, an insulating substrate is pierced with a plurality of through-holes arranged on the faces of the substrate in a predefined pattern along a closed square contour around a central opening. The coil is formed by passing an electrical conductor through the through-holes so as to form turns centred on the contour line.

Printed circuit board Rogowski windings (PCB Rogowski coils) have the particular advantages of being relatively simple and inexpensive to manufacture on an industrial scale. They are also easy to miniaturize.

One drawback of such printed circuit board Rogowski sensors is that their gain is low and may not be enough to be used in certain applications, in particular in applications linked to the protection of electricity distribution installations, for example when these sensors are used as current sensors in trip mechanisms of circuit breakers. Such sensors may also be subject to diaphony problems, thereby possibly complicating the detection of an electrical fault such as a short-circuit current.

There is therefore a need for current sensors, in particular printed circuit board Rogowski windings, that rectify these drawbacks.

SUMMARY

According to a first aspect of the invention, a current sensor includes:
- an insulating substrate provided with a central opening;
- a Rogowski winding surrounding the central opening and including a first coil and a second coil which are superposed and electrically connected in series, the first coil and the second coil being wound around the substrate along a first contour line and a second contour line, respectively, each contour line defining, in the plane of the substrate, a contour in the shape of a quadrilateral centred on the central opening;

wherein the length of the contour in the shape of a quadrilateral defined by the first contour line is greater than the length of the quadrilateral defined by the second contour line and the width thereof is smaller than the width of the quadrilateral defined by the second contour line.

According to some advantageous but non-mandatory aspects, such a current sensor may incorporate one or more of the following features, taken alone or in any technically admissible combination:

Each of the coils is shared into a plurality of coil segments arranged around the central opening while being superposed and substantially aligned along the contour lines, each of said segments including a plurality of turns at least partly received in through-orifices pierced in the substrate, the through-orifices being aligned along rows.

For each coil portion, the orifices associated with the first and second coils are arranged in a quincunx.

Each turn, in the upper and lower faces of the coil, includes a diagonally oriented rectilinear portion, the rectilinear portions of the coils, in each coil segment, being aligned along a cover strip extending parallel to said rows.

The current sensor includes a connection area formed in one of the coil segments, said connection area including through-orifices arranged in a predefined pattern, the current sensor furthermore including additional through-orifices arranged in the same pattern and arranged in another of the coil segments symmetrically with respect to the connection area.

The through-orifices are through-vias extending through the entire depth of a central layer of the substrate.

Said coils also include angled areas each arranged in the angle between two adjacent coil segments and through which the electrical conductors of said coils pass in order to connect the coil segments.

Metal solder pads are arranged on the substrate at locations aligned with the turns of one of the coils of the winding.

A shielding structure is formed on at least part of the substrate in order to protect the sensor from electromagnetic interference, this structure including an electrically conductive track connected to electrical ground.

According to another aspect of the invention, a measurement system includes a current sensor as described above and an electronic processing circuit configured so as to process the signal measured by the current sensor.

BRIEF DESCRIPTION OF THE DRAWINGS

The invention will be better understood and other advantages thereof will become more clearly apparent in the light of the following description of one embodiment of a current sensor, given solely by way of example and with reference to the appended drawings, in which.

DETAILED DESCRIPTION

Figure 1:
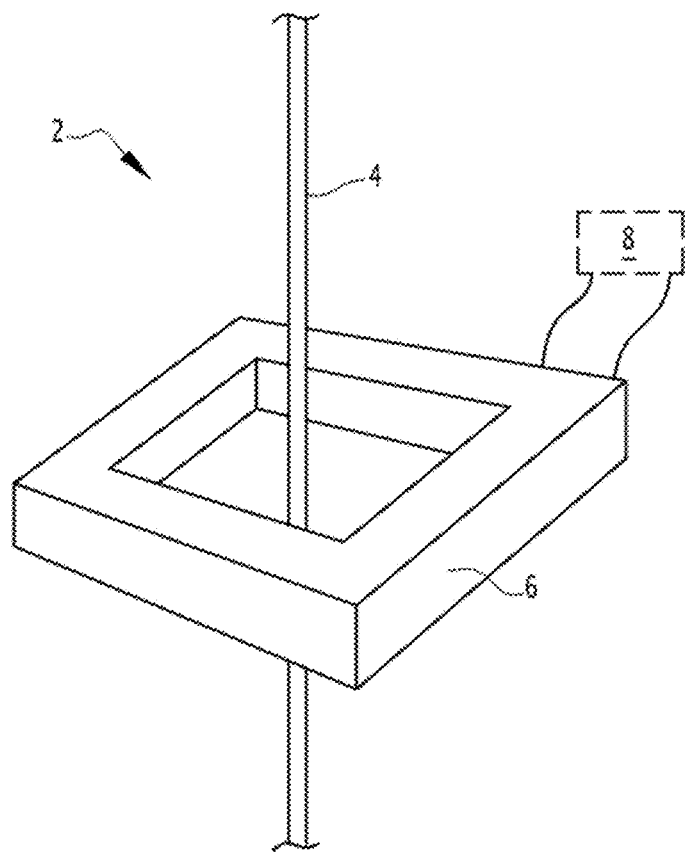
FIG. 1 is a schematic depiction of a measurement system including a current sensor according to some embodiments of the invention.

FIG. 1 shows a measurement system 2 for measuring the intensity of an electric current flowing through an electrical conductor 4, such as a cable or a wire or a busbar.

The system 2 in this case includes a current sensor 6 and an electronic processing circuit 8 connected to the current sensor 6 and configured so as to process the signal measured by the current sensor 6.

According to some embodiments, the current sensor 6 includes a Rogowski winding formed on a substrate and including two coils which are electrically connected in series, these coils being superposed and wound around the substrate.

End terminals of the winding are connected to an input of the processing circuit 8.

According to some examples, the current flowing through the electrical conductor induces an electric voltage across the terminals of the winding. This voltage is proportional to the time derivative of the intensity of the current flowing through the conductor 4. The processing circuit 8 is for example configured so as to calculate the value of the current from the voltage signal supplied at the output of the current sensor 6.

According to some embodiments, the current sensor 6 and the processing circuit 8 may be mounted on one and the same printed circuit board.

Figure 2:
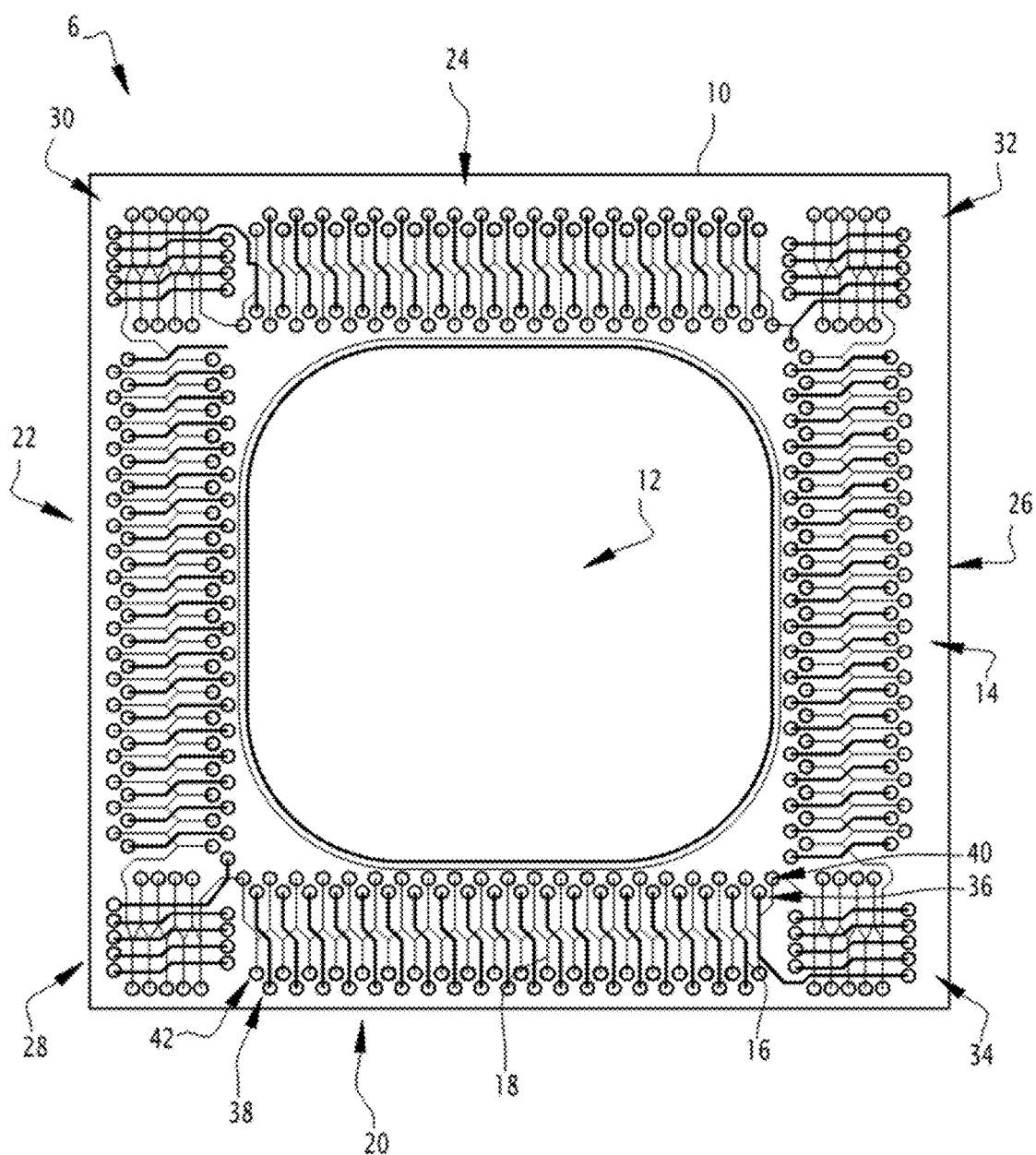
FIG. 2 is a schematic depiction of a current sensor according to a first embodiment of the invention in an elevated view.
Figure 3:
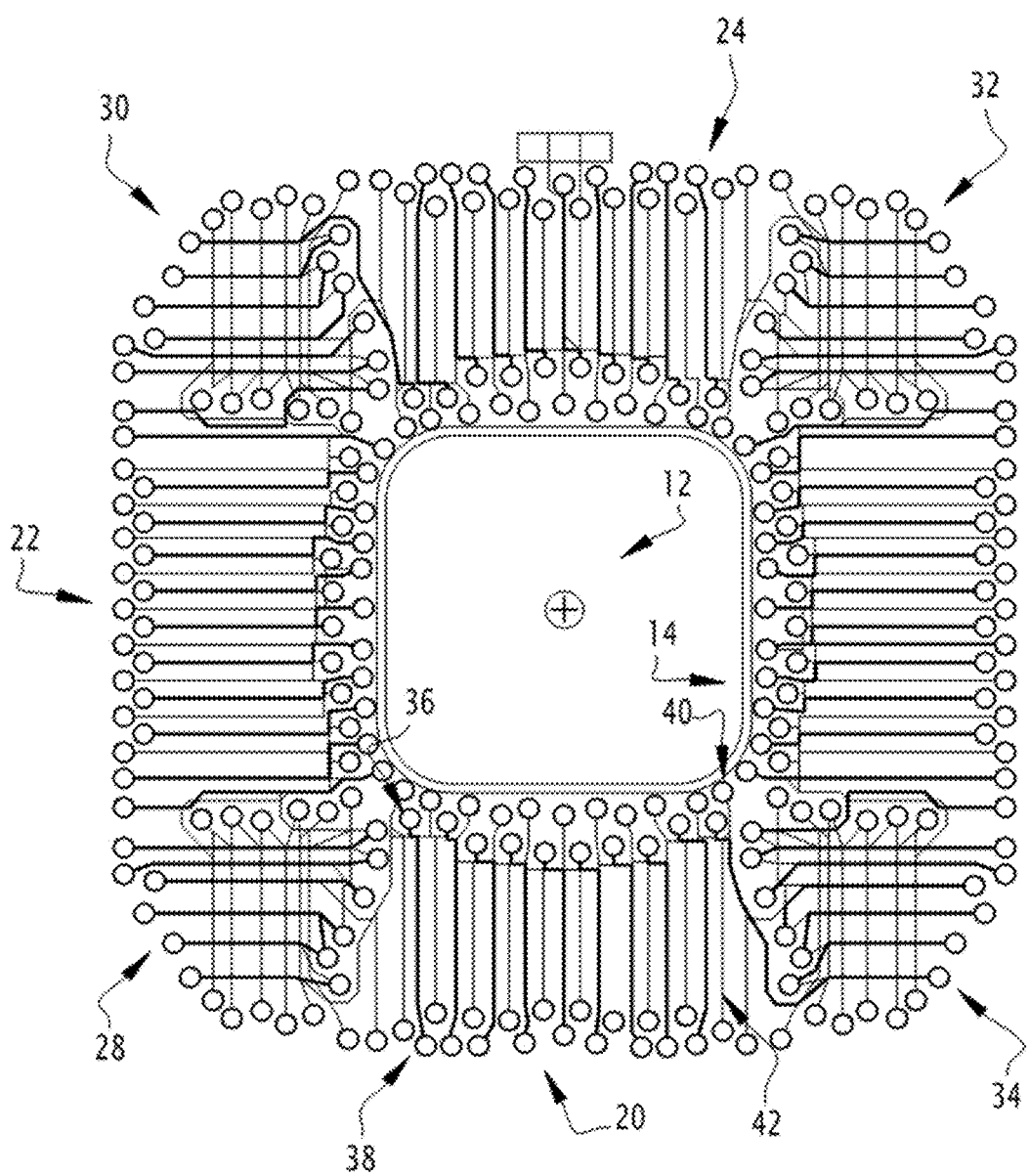
FIG. 3 is a schematic depiction of a current sensor according to a variant of the first embodiment of the invention in an elevated view.

A first embodiment of the current sensor 6 is shown in FIGS. 2 and 3.

The current sensor 6 includes an electrically insulating substrate 10 that preferably has a planar shape.

According to some examples, the substrate 10 is a printed circuit board including a layer or a plurality of stacked layers of a cured polymer material, such as an FR-4 epoxy resin.

The substrate 10 may for example be manufactured through lamination or through material deposition or through additive manufacturing or through any other appropriate method.

The coils are for example formed by winding electrically conductive wires or by depositing metal layers during the manufacture of the substrate 10.

As illustrated in FIGS. 2 and 3, the current sensor 6 includes a Rogowski winding 14 surrounding an opening 12 formed on the substrate 10.

The opening 12 is preferably situated in a central position of the substrate 10.

For example, the opening 12 has the shape of a polygon, such as a quadrilateral. As a variant, other shapes may be contemplated, such as a circle or an ellipse.

The winding 14 includes a first coil 16 and a second coil 18 which are superposed and electrically connected in series. The first coil 16 and the second coil 18 are wound around the substrate along a first contour line C1 and a second contour line C2, respectively.

Each contour line C1 and C2 defines, in the plane of the substrate 10, a contour in the shape of a quadrilateral centred on the central opening. For example, the quadrilateral is a rectangle.

As may be seen in FIG. 2, the coils 16 and 18 of the winding 14 are superposed and are interlaced with one another. For example, "interlaced" is understood to mean that, over at least part of the length of the closed contour, the respective turns of the coils 16 and 18 are arranged alternately.

Preferably, said coils 16 and 18 are offset with respect to one another in a direction perpendicular to the plane of the substrate 10.

For example, each coil 16, 18 includes an upper face and a lower face that extend in geometric planes parallel to the plane of the substrate 10. The electrical conductors forming the coils 16 and 18 then extend between the upper and lower faces, passing through at least part of the thickness of the substrate 10 by way of through-holes oriented in directions perpendicular to the plane of the substrate 10, such as vias pierced in the substrate 10.

For example, the upper face of the coil 18 is arranged on the upper face of the substrate 10. The lower face of the coil 18 is arranged in a first internal layer in the substrate 10. The upper face of the coil 16 is arranged in a second internal layer in the substrate 10 and its lower face is arranged on the lower face of the substrate 10, the second internal layer in this case being situated between the upper face of the substrate 10 and the first internal layer.

In the illustrated example, FIG. 2 shows a view of the upper face of the substrate 10. The electrical conductors of the coil 18 are shown in thin lines, and only the electrical conductors of the coil 16 that are situated at the internal layer are shown in thick lines, those arranged on the lower face of the substrate 10 not being depicted for ease of reading in the figure.

According to some examples, each of the coils 16 and 18 is shared into a plurality of rectilinear coil portions arranged around the opening 12. These coil portions, also called coil segments hereinafter, are arranged so as to define a quadrilateral around the opening 12 and are aligned substantially along the contour lines C1 and C2.

As a variant, the coil segments are not necessarily rectilinear and may have a rounded or circular-arc shape.

In the illustrated example, four coil segments 20, 22, 24 and 26 are arranged end-to-end at a right angle around the opening 12, parallel to the plane of the substrate 10, so as to form a square or a rectangle around the opening 12. The segments 20 and 24 are parallel and face one another on either side of the opening 12. The segments 22 and 26 are arranged face-to-face on either side of the opening 12 and are oriented perpendicular to the segments 20 and 24.

The coils 16 and 18 also include angled areas 28, 30, 32 and 34 each arranged in the angle between two adjacent coil segments. The electrical conductors of the coils 16 and 18 pass through these angled areas so as to connect the coil segments in pairs. In the illustrated example, the angled area 28 is adjacent to the coil segments 20 and 22; the angled area 30 is adjacent to the coil segments 22 and 24, and so on.

Preferably, in each of said segments 20, 22, 24, 26, each coil 16, 18 is wound into a plurality of turns that are at least partly formed by through-orifices pierced in the substrate, the through-orifices being aligned along rows 36, 38, 40, 42.

For each coil segment 20, 22, 24 and 26, in the second internal layer, the conductors of the coil 16 extend between a first row 36 of through-orifices and a second row 38 of through-orifices. In the coil portions 20 and 24, the first row 36 is closer to the opening 12 than the second row 38, whereas, for the coil portions 22 and 24, the second row 38 is closer to the opening 12 than the first row 26.

In the same way, for each coil segment 20, 22, 24 and 26, in the upper face of the substrate 10, the conductors of the coil 18 extend between a third row 40 of through-orifices and a fourth row 42 of through-orifices. In the coil segments 20 and 24, the third row 40 is closer to the opening 12 than the fourth row 42, whereas, for the coil segments 22 and 24, the fourth row 42 is closer to the opening 12 than the third row 40.

For example, the orifices of the first row 36 are arranged in a quincunx with the orifices of the third row 40. The orifices of the second row 38 are arranged in a quincunx with the orifices of the fourth row 42.

The lower faces of the coils 18 and 16 are arranged in the same way, respectively, on the lower face of the substrate 10 and in the first internal layer.

Figure 4:
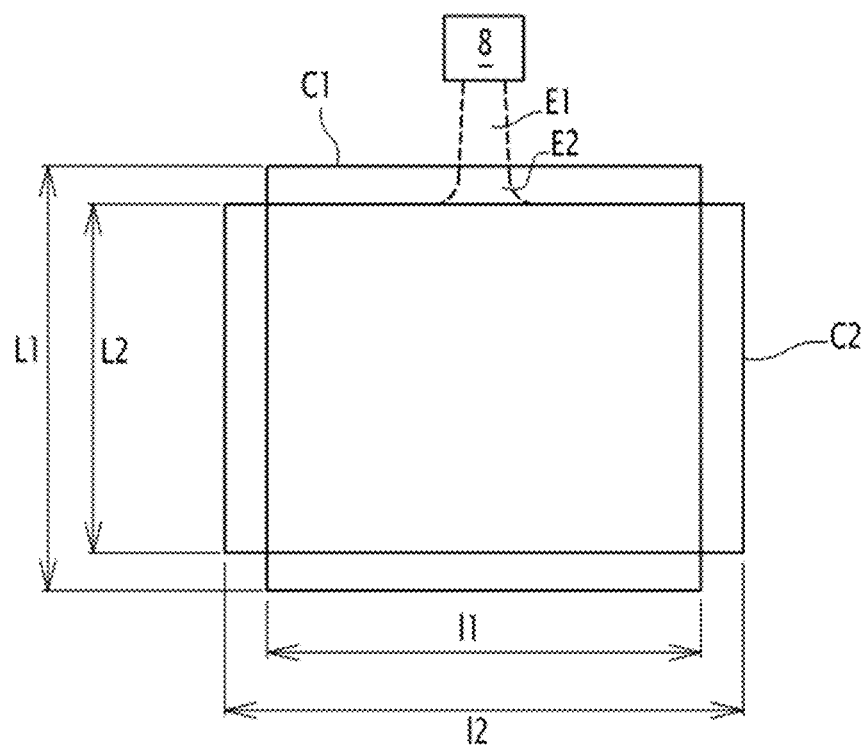
FIG. 4 is a simplified schematic depiction illustrating the superposition of coils of the current sensor of FIG. 2.

As illustrated in FIG. 4, the length L1 of the contour in the shape of a quadrilateral defined by the first contour line C1 is greater than the length L2 of the quadrilateral defined by the second contour line C2 and the width l1 thereof is smaller than the width l2 of the quadrilateral defined by the second contour line C2.

This arrangement affords the sensor 6 better immunity against diaphony phenomena, in particular when the winding is subjected to a uniform magnetic field. Specifically, the superposition of the two coils having equivalent surface areas but whose directions oppose one another makes it possible to eliminate the contribution of a uniform field perpendicular to the sensor. The quality of the measurement is therefore improved.

Advantageously, each contour C1 and C2 has a protuberance, respectively denoted E1 and E2, which makes it possible to connect the coils to the processing circuit 8. Preferably, the protuberances E1 and E2 are superposed.

According to some examples, in each of the rows 36, 38, 40 and 42, the orifices are arranged with a regular spacing and are preferably aligned rectilinearly. However, as a variant, the rows are not necessarily rectilinear, as will be seen in the example of FIG. 3.

The coils 16 and 18 are interlaced such that, for each coil segment 20, 22, 24 and 26, the orifices of the first row 36 are aligned with the orifices of the fourth row 42 and the orifices of the second row 38 are aligned with the orifices of the third row 40.

According to some embodiments, a similar pattern may be used for the angled areas 28, 30, 32 and 34. For example, in the angled area 28, orifices for the conductor of the coil 18 are aligned in two parallel rows situated in the extension of the rows 38 and 40 of the coil portion 20. Orifices for receiving the conductor of the coil 16 are aligned in two parallel rows situated in the extension of the rows 36 and 42 of the coil portion 22. The angled portions 30, 32 and 34 are constructed in the same way.

One exemplary layout of the turns of the winding is now described. According to some embodiments, the turns of the winding have a pattern that takes into account the quincunx arrangement of the orifices.

For example, in each segment 20, 22, 24 and 26, the coil 16 has a pattern in which, in the upper face of the coil, the electrical conductor forming the coil 16 includes a first rectilinear portion that extends from the row 40 in the direction of the opposite row 42 parallel to the plane of the substrate 10 and perpendicular to said row 40.

The first rectilinear portion is extended by a second diagonally oriented rectilinear portion that is itself extended by a third rectilinear portion parallel to the first rectilinear portion. These second and third portions are parallel to the plane of the substrate 10 and are coplanar with the first rectilinear portion. This diagonal portion makes it possible to laterally offset the electrical conductor such that it is located facing the corresponding orifice of the row 42, rather than facing one of the orifices of the row 38 provided for the second coil 18. The length of the third portion is similar or equal to that of the first portion.

The conductor then extends towards the lower face of the coil 18 by dropping through said orifice. Once this opposite face has been reached, the conductor extends from the row 42 to the row 40 with a similar fourth rectilinear portion which is superposed with the third rectilinear portion. The fourth portion is extended by a fifth diagonally oriented rectilinear portion, in the same way as the second portion, except that it is inclined towards the opposite side. Preferably, the fifth portion has a length equal or substantially equal (that is to say preferably less than or equal to 10%) to the length of the second portion. This fifth portion is itself extended towards a corresponding orifice of the row 40 by a sixth rectilinear portion parallel to the fourth rectilinear portion. These fifth and sixth portions are parallel to the plane of the substrate 10 and are coplanar with the fourth rectilinear portion.

The conductor then passes back up to the upper face of the coil 18 and the same pattern is reproduced as described above.

The coil 16 has a similar pattern along the rectilinear portions, except for the fact that it is offset with respect to that of the previous coil, due to the quincunx arrangement of the orifices along the rows 36 and 40 and the rows 38 and 42. Such a pattern is not completely visible in FIG. 1, which does not show the arrangement of the conductor in the lower portion of the coil 16 for the sake of clarity. A similar pattern is by contrast readily visible in FIG. 5 described below with reference to the coil 504. In particular, the conductor of the coil 504 includes rectilinear portions similar to those of the conductor of the coil 18. The diagonally oriented portions are themselves also offset laterally with respect to those of the conductor of the coil 18, while at the same time being arranged vertical thereto, for example by being aligned therewith along a cover strip that extends parallel to the rows 36, 38, 40 and 42, for example situated midway between the rows 36 and 42.

In other words, each turn includes, in the upper and lower faces of the coil, a diagonally oriented rectilinear portion, the rectilinear portion of the coils, in each coil segment, being aligned along a cover strip extending parallel to said rows 36, 38, 40 and 42.

This arrangement makes it possible to achieve a compact winding with a high turns density, thereby improving the performance of the sensor 6.

Similar patterns may be used for the angled areas 28, 30, 32 and 34, except that the conductors of the coil 16 are not arranged parallel to that of the coil 18, but are by contrast oriented perpendicular thereto in the plane of the substrate 10.

As a variant, as illustrated in FIG. 4, the rows are not necessarily rectilinear and may follow rounded contours, for example in the shape of a circular arc. This non-rectilinear arrangement may be useful for optimizing the arrangement of the orifices and thus saving space on the substrate 10. The alignment of the orifices may thus only be partly rectilinear, that is to say that at least some of the orifices (for example up to 20% or 40% or 60% of the orifices) of the row are misaligned.

Figure 5:
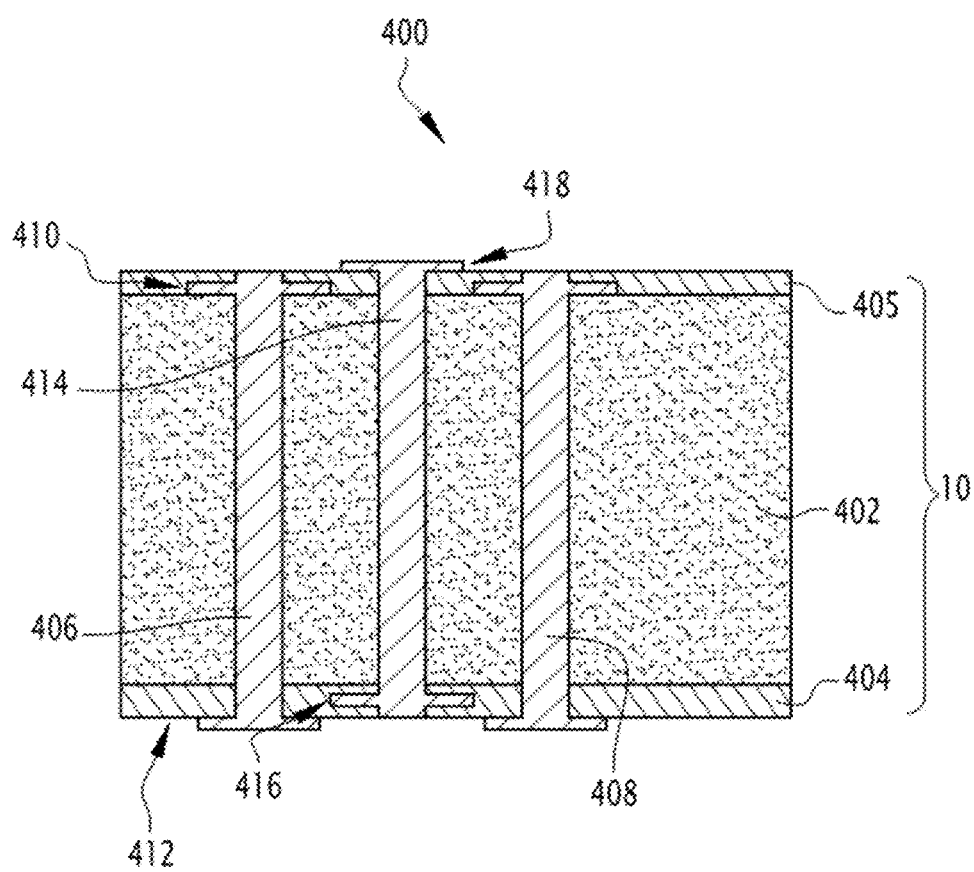
FIG. 5 is a schematic depiction of a current sensor according to a second embodiment of the invention.

FIG. 5 shows one embodiment of the invention that may be combined with the embodiments of FIG. 2 or 3 or, as an alternative, be implemented independently of these embodiments.

In this figure, a portion of a sensor 400 similar to the sensor 6 is shown in a sectional view in a geometric plane perpendicular to the plane of the substrate 10.

According to some examples, the substrate 10 includes a layer 402 covered by a lower layer 404 and an upper layer 405.

The sensor 400 includes a Rogowski winding including coils performing a role similar to the coils 16 and 18 but which are furthermore interwoven within the substrate 10.

A plurality of first through-vias 406, 408 are formed in the substrate 10, these each extending in a direction perpendicular to the plane of the substrate 10, between an upper end 410 formed at the junction between the layers 405 and 402 and a lower end 412 formed on the lower layer 404. The first vias 406, 408 are for example associated with the second coil 18 of the winding.

A plurality of second through-vias 414, only one of which is visible in FIG. 4, each extend, in a direction perpendicular to the plane of the substrate 10, between a lower end 416 at the junction between the layers 404 and 402 and an upper end 418 formed on the layer 405. The second vias 414 are for example associated with the first coil 16 of the winding.

It is understood that the through-vias 406, 408 and 414 make it possible to form the through-orifices that are used to channel the turns of the coils of the winding. The through-vias extend through the entire depth of the layer 402.

The substrate 10 may thus more easily be structured so as to interweave the coils of the winding. In particular, the manufacturing method is simplified as just one metallization step is necessary, unlike substrates formed by stacking layers and in which blind vias open out into an intermediate layer of the stack, which require at least three separate metallization steps, thereby increasing the cost and the complexity of the manufacturing method.

FIG. 5 shows another embodiment of the sensor 6. A sensor 500 similar to the sensor 6 described above comprises a winding 502 including a first coil 504 and a second coil 506 that are wound on a substrate provided with an opening 508. The coils 504 and 506 include winding segments 510, 512, 514 and 516 that are similar to the winding portions 20 to 26 described above.

The sensor 500 differs in particular from the sensor 6 in that it includes at least one connection area 518 formed in one of the coil portions so as to allow the winding to be electrically connected to the processing circuit 8.

For example, the connection area 518 includes contact pads to which a terminal end of each of the coils 504 and 506 is connected. For example, the connection area 518 is formed halfway through the width of the coil portion 514.

In order to allow the electrical conductors of the coils 506 and 508 to pass to the connection pads through the substrate 10, the connection area 518 includes additional through-orifices. In the illustrated example, these additional through-orifices are formed at the rows of orifices (similar to the rows 38 and 42 described above) situated close to the edge of the substrate 10. Said additional through-orifices are arranged in a predefined pattern.

Advantageously, a similar pattern 520 (but not necessarily including said additional through-orifices) is arranged on the coil segment 510 symmetrically in relation to the connection area 518.

This arrangement makes it possible to maintain symmetry of the winding. The coils may therefore easily be connected to a measurement circuit external to the sensor 500 without otherwise having to introduce anisotropic sensor behaviour. Additional patterns 522 and 524 of a similar shape are preferably arranged symmetrically on the other coil segments 512 and 514.

Figure 6:
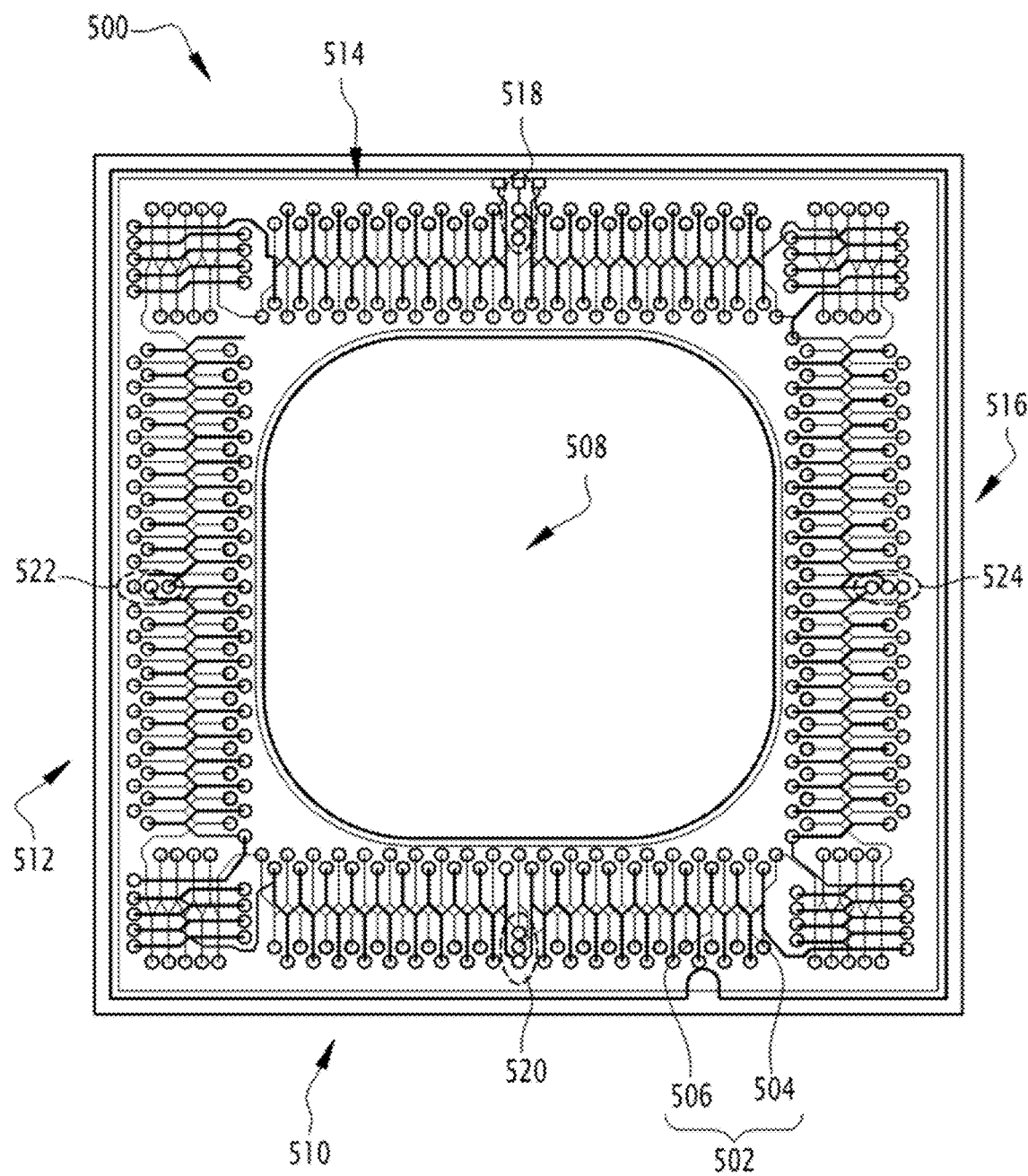
FIG. 6 is a schematic depiction of a current sensor according to a third embodiment of the invention.
Figure 7:
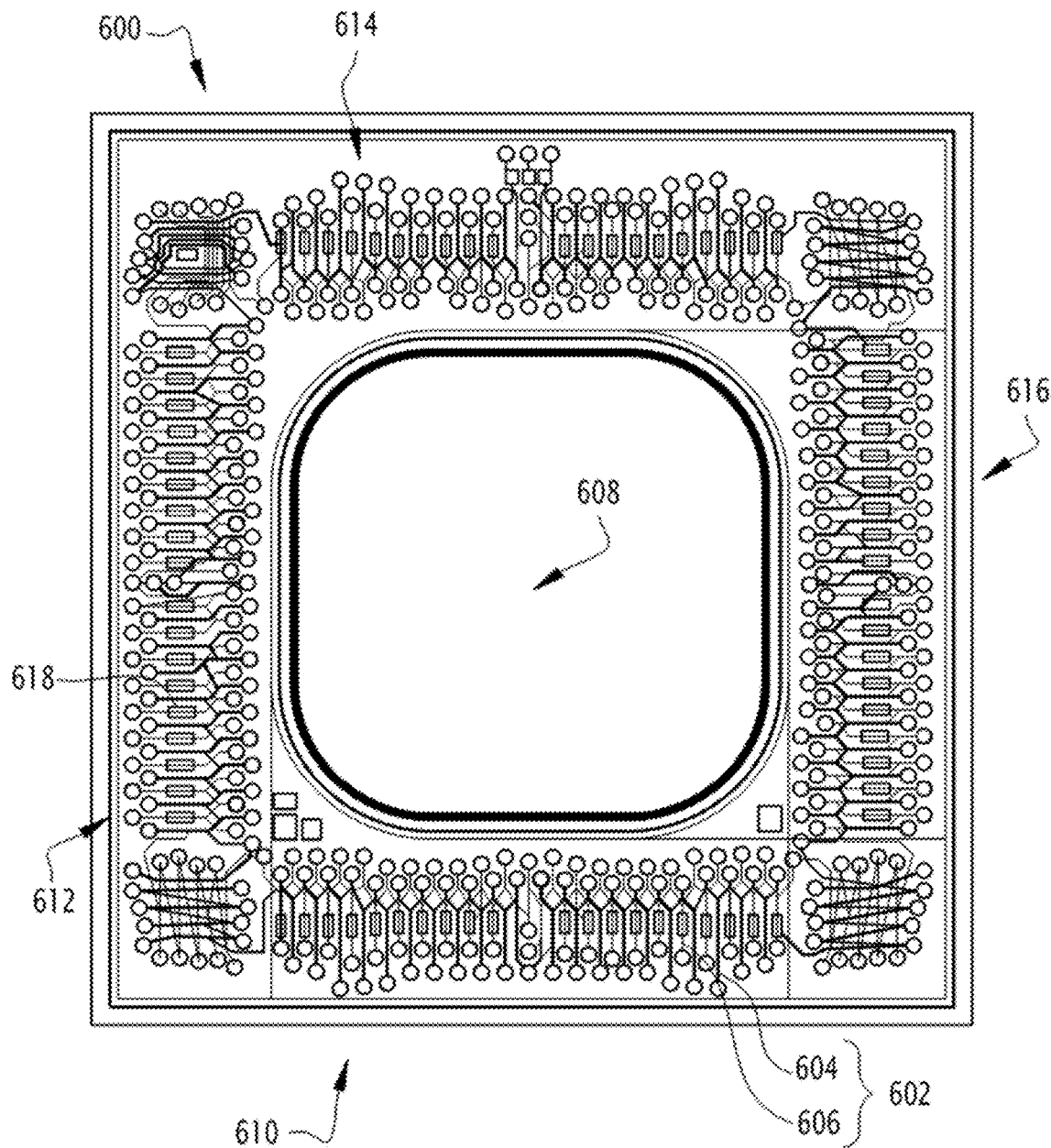
FIG. 7 is a schematic depiction of a current sensor according to a fourth embodiment of the invention.

FIGS. 6 and 7 show other embodiments of the sensor 6 or of the sensor 500.

A sensor 600 similar to the sensor 6 described above and that comprises a winding 602 including a first coil 604 and a second coil 606 that are wound on a substrate provided with an opening 608 is described with reference to FIG. 6. The coils 604 and 606 include coil segments 610, 612, 614 and 616 similar to the coil portions 20 to 26 described above.

The sensor 600 differs in particular from the sensor 6 in that the metal pads 618 are arranged on the substrate 10, for example on the upper face of the substrate 10. The pads 618 form solder pads for allowing at least two sensors to be assembled through soldering with good mechanical strength. The pads 618 have for example a rectangular shape.

The metal pads 618 are preferably arranged at locations that are aligned with the turns of one of the coils of the winding, for example with the coil 606. In the illustrated example, these locations are situated in the coil segments 610, 612, 614 and 618 vertical to the turns of the coil 606, preferably above the turns of the coil 606.

As the upper face of the coil 606 extends into one of the internal layers in the substrate 10 underneath the upper face of the substrate 10, the sheets 618 are not in contact with the coil 606. The sheets 618 are furthermore dimensioned so as not to be in contact with the coil 604 and are thus electrically isolated from the winding 602.

This arrangement makes it possible to keep a compact winding with a high turns density.

Preferably, each sheet 618 is situated midway between the rows of orifices 36 and 42. To this end, the shape of the turns of the coils 604 and 606 may be modified, for example by shifting the diagonal portions of the conductors towards one of the rows 36 or 42, as may be seen in FIG. 6. The shape of the rows 36, 38, 40 or 42 may then be modified locally so as no longer to have a rectilinear alignment.

Instead, the alignment may be partially rectilinear, that is to say that at least some of the orifices (for example up to 20% or 40% or 60% of the orifices) of the row are misaligned.

A sensor 700 similar to the sensor 7 and that comprises a winding 702 including a first coil 704 and a second coil 706 that are wound on a substrate provided with an opening 708 is described with reference to FIG. 7. The coils 704 and 706 include coil segments 710, 712, 714 and 716 similar to the coil segments 610, 612, 614 and 616. The sensor 700 also includes reinforcement sheets similar to the sheets 618 but that are not visible in FIG. 7.

The sensor 700 differs in particular from the sensor 600 in that the shape of some of the rows may be modified, for example following a curved circular-arc shape, as illustrated by way of example by the dotted line referenced 718. The angled areas of the coils 704 and 706 may also be modified so as to receive reinforcement sheets similar to the sheets 618.

Figure 8:
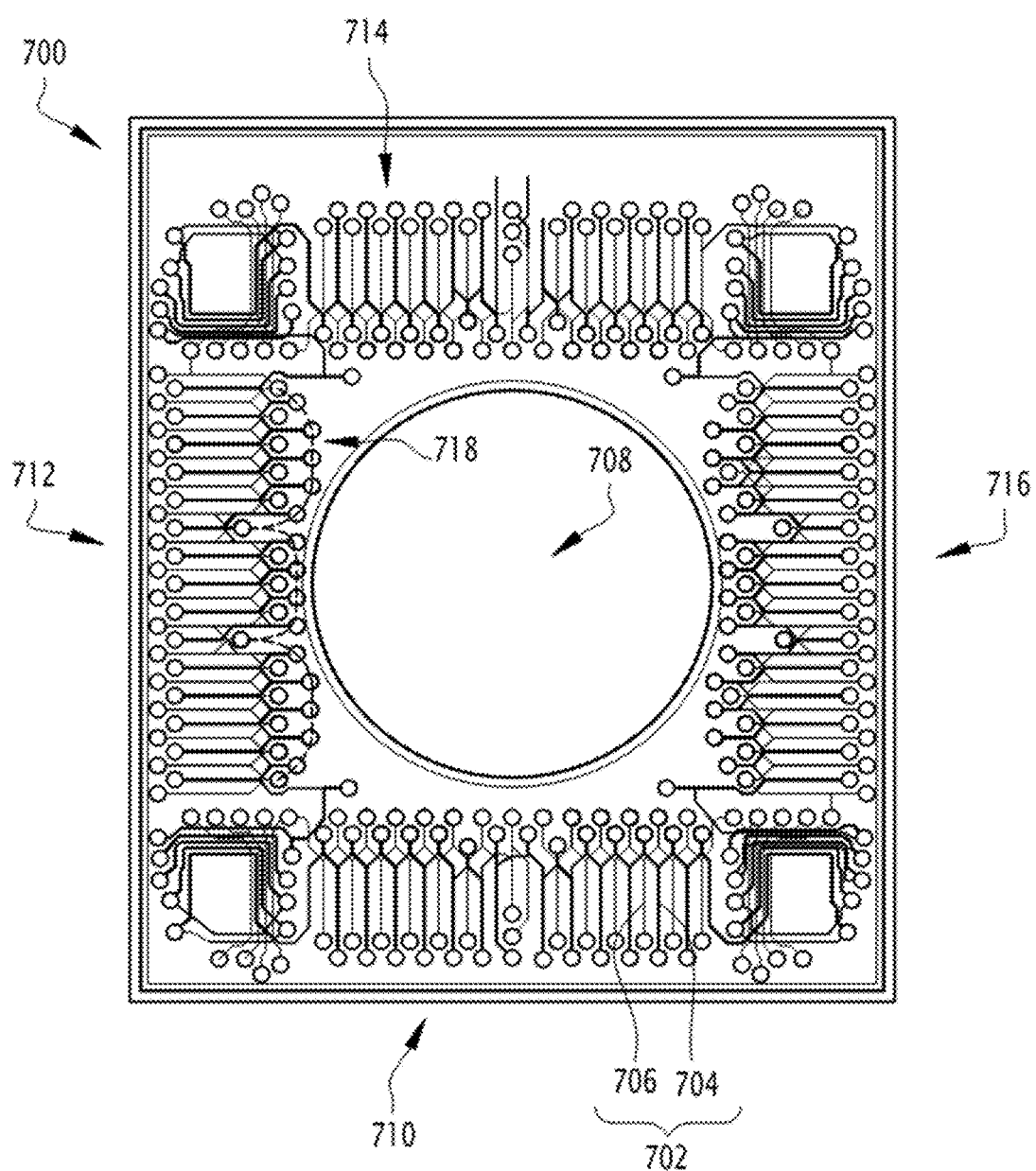
FIG. 8 is a schematic depiction of a current sensor according to a fifth embodiment of the invention.
Figure 9:
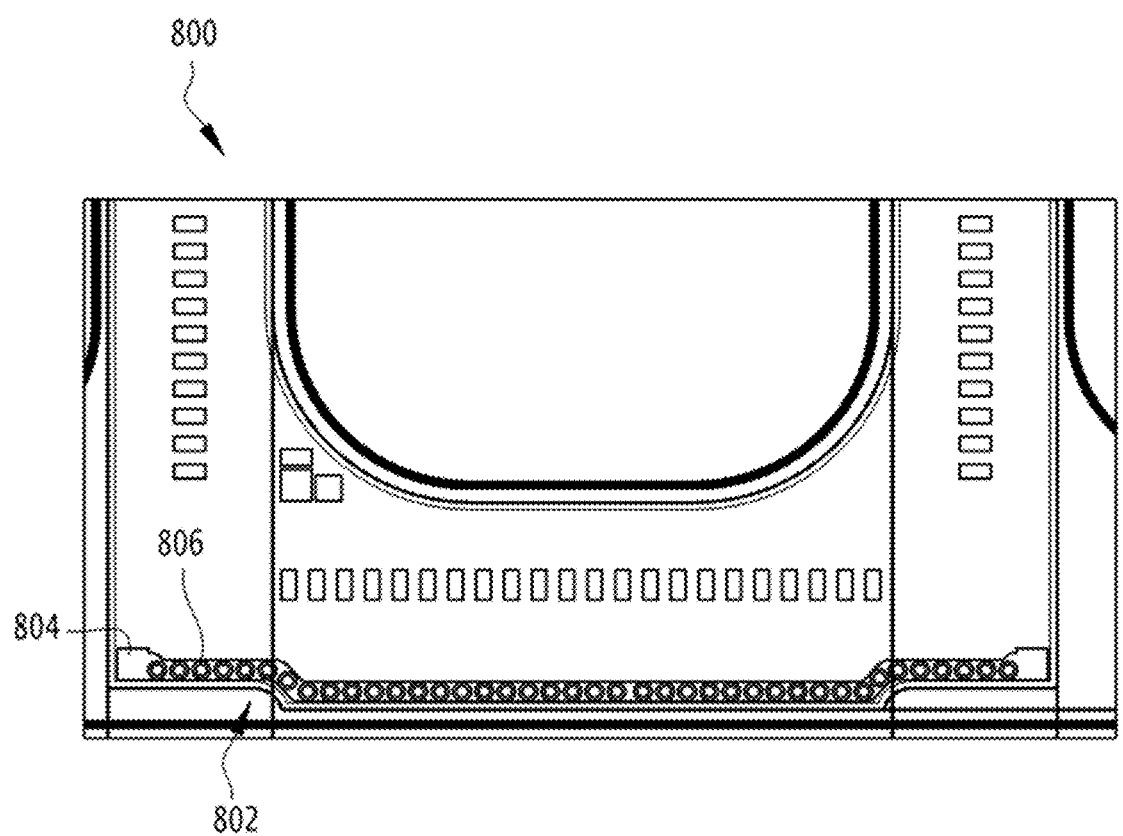
FIG. 9 is a schematic depiction of a current sensor according to a sixth embodiment of the invention.

FIG. 8 describes another embodiment of the sensor 6. In this embodiment, the sensor 800 includes, on at least part of the substrate, a shielding structure 802 in order to protect the sensor from electromagnetic interference. The structure 802 is preferably arranged on an edge of the substrate in order to avoid electromagnetic coupling between the winding and the electric power supply of the measurement system 2.

For example, the structure 802 includes an electrically conductive track 804 connected to electrical ground, for example to electrical ground of the system 2, this track 804 being deposited on a face of the substrate.

Advantageously, holes 806 are pierced in the substrate along the track 804.

The embodiments and the variants contemplated above may be combined with one another in order to create new embodiments.

In particular, each of the embodiments described with reference to the various figures may be implemented independently of the other embodiments.

The invention claimed is:
1. A current sensor comprising:
an insulating substrate provided with a central opening;
a Rogowski winding surrounding the central opening and including a first coil and a second coil which are superposed and electrically connected in series, the first coil and the second coil being wound around the substrate along a first contour line and a second contour line, respectively, each contour line defining, in the plane of the substrate, a contour in the shape of a quadrilateral centred on the central opening;

wherein a length of the contour in the shape of a quadrilateral defined by the first contour line is greater than a length of the quadrilateral defined by the second contour line and a width thereof is smaller than a width of the quadrilateral defined by the second contour line.

2. The current sensor according to claim 1, wherein each of the first and second coils is shared into a plurality of coil segments arranged around the central opening while being superposed and substantially aligned along the first and second contour lines, each of said plurality of coil segments including a plurality of turns at least partly received in through-orifices pierced in the substrate, the through-orifices being aligned along rows.

3. The current sensor according to claim 2, wherein, for each coil portion, the orifices associated with the first and second coils are arranged in a quincunx.

4. The current sensor according to claim 3, wherein each turn, in upper and lower faces of the coil, includes a diagonally oriented rectilinear portion, the rectilinear portions of the coils, in each coil segment, being aligned along a cover strip extending parallel to said rows.

5. The current sensor according to claim 2, wherein the current sensor includes a connection area formed in one of the coil segments, said connection area including through-orifices arranged in a predefined pattern, the current sensor furthermore including additional through-orifices arranged in the same predefined pattern and arranged in another of the coil segments symmetrically in relation to the connection area.

6. The current sensor according to claim 2, wherein the through-orifices are through-vias extending through an entire depth of a central layer of the substrate.

7. The current sensor according to claim 2, wherein said first and second coils also include angled areas each arranged in an angle between two adjacent coil segments and through which the electrical conductors of said coils pass in order to connect the coil segments.

8. The current sensor according to claim 1, wherein metal solder pads are arranged on the substrate at locations aligned with the turns of one of the coils of the winding.

9. The current sensor according to claim 1, wherein a shielding structure is formed on at least part of the substrate in order to protect the sensor from electromagnetic interference, the shielding structure including an electrically conductive track connected to electrical ground.

10. A measurement system, comprising a current sensor according to claim 1 and an electronic processing circuit configured so as to process a signal measured by the current sensor.

* * * * *